United States Patent [19]

Ledzius et al.

[11] Patent Number: 4,691,124
[45] Date of Patent: Sep. 1, 1987

[54] SELF-COMPENSATING, MAXIMUM SPEED INTEGRATED CIRCUIT

[75] Inventors: Robert C. Ledzius, Chandler; Steven P. Allen, Mesa, both of Ariz.

[73] Assignee: Motorola, Inc., Schaumburg, Ill.

[21] Appl. No.: 863,915

[22] Filed: May 16, 1986

[51] Int. Cl.⁴ .................. H03K 5/14; H03K 5/135; H03K 3/72
[52] U.S. Cl. .................. 307/303; 307/269; 307/443; 307/480; 307/491; 307/271
[58] Field of Search ............. 307/269, 271, 303, 443, 307/480, 481, 511, 491; 364/571

[56] References Cited

U.S. PATENT DOCUMENTS 3,829,790  8/1974  Macrander .................. 307/480
4,287,437  9/1981  Brosch et al. ................ 307/511
4,454,483  6/1984  Baylor ......................... 331/11
4,494,021  1/1985  Bell et al. .................... 307/481
4,613,775  9/1986  Dick ............................. 307/480

Primary Examiner—John Zazworsky
Attorney, Agent, or Firm—Lowell W. Gresham

[57] ABSTRACT

An integrated circuit which contains an on-chip clock that operates the integrated circuit at its true maximum speed is disclosed. The integrated circuit operates asynchronously from a processor bus and contains circuitry for interfacing with the processor bus. A clock generator is constructed using information obtained from identifying a slowest signal path of the integrated circuit. The clock may be stopped and started under processor control to permit communication between the IC and processor bus.

12 Claims, 4 Drawing Figures

4,691,124

1

SELF-COMPENSATING, MAXIMUM SPEED INTEGRATED CIRCUIT

BACKGROUND OF THE INVENTION

This invention relates generally to an integrated circuit (IC) which performs a dedicated task and requires a clock signal. Specifically, the IC of the present invention performs its dedicated task in a background mode from a processor's prospective. Further, the IC performs this dedicated task substantially independent of interaction with the processor and other devices.

Most ICs which require a clock signal specify a maximum speed at which the IC operates. This specification typically takes the form of a maximum frequency or minimum time period that the clock signal must observe. The maximum speed specification typically accounts for temperature and process variations. In effect, each IC may be guaranteed to operate at least at the specified maximum speed regardless of a particular operating temperature within an acceptable temperature range or a particular wafer or batch in which the IC is processed. Accordingly, the specified maximum speed is slower than a true maximum speed at which most ICs will operate.

Conventional design rules require a circuit designer to supply an IC with a clock signal that is slower than the specified maximum speed to insure proper operation over a wide variation in conditions. However, this technique almost certainly causes the IC to constantly operate slower than the true maximum speed.

Depending upon the application, undesirable consequences result. In certain ICs which perform dedicated digital signal processing tasks, a reduced precision may result from accomplishing less processing in a given time frame than could result from using a clock operating at a true maximum speed. Likewise, in certain cryptography applications where an IC performs a dedicated cryptographic algorithm, a user may be forced to wait undesirably long periods of time, which could be reduced by utilizing a clock operating at a true maximum speed.

SUMMARY OF THE INVENTION

Accordingly, it is an object of the present invention to provide an improved integrated circuit (IC) which successfully operates at its true maximum speed.

Another object of the present invention concerns providing an improved IC that is self-compensated so that IC speed changes with temperature and process variations to insure operation at the IC's true maximum speed.

Yet another object of the present invention concerns providing an improved IC which contains a clock generator for generating a clock signal that drives functional circuitry which performs a dedicated task.

Still another object of the present invention concerns providing an improved IC which operates asynchronously with other devices.

The above and other objects and advantages of the present invention are carried out in one form by a self-compensated IC which includes within the IC a functional circuit and a clock generator. The functional circuit performs a dedicated task and requires a clock signal input for operation thereof. The clock generator is constructed on the same substrate as the functional circuit and generates the clock signal for operation of the functional circuit. The clock signal exhibits a frequency that is determined by a propagation delay of a delay element portion of the clock generator. This delay element propagation delay has a predetermined relationship relative to a propagation delay of a slowest signal path of the functional circuit.

BRIEF DESCRIPTION OF THE DRAWINGS

A more complete understanding of the present invention may be derived by reference to the detailed description and the claims when considered in connection with the accompanying drawings, in which like reference numbers indicate similar parts, and wherein:

DETAILED DESCRIPTION OF THE PREFERRED EMBODIMENTS

Figure 1:
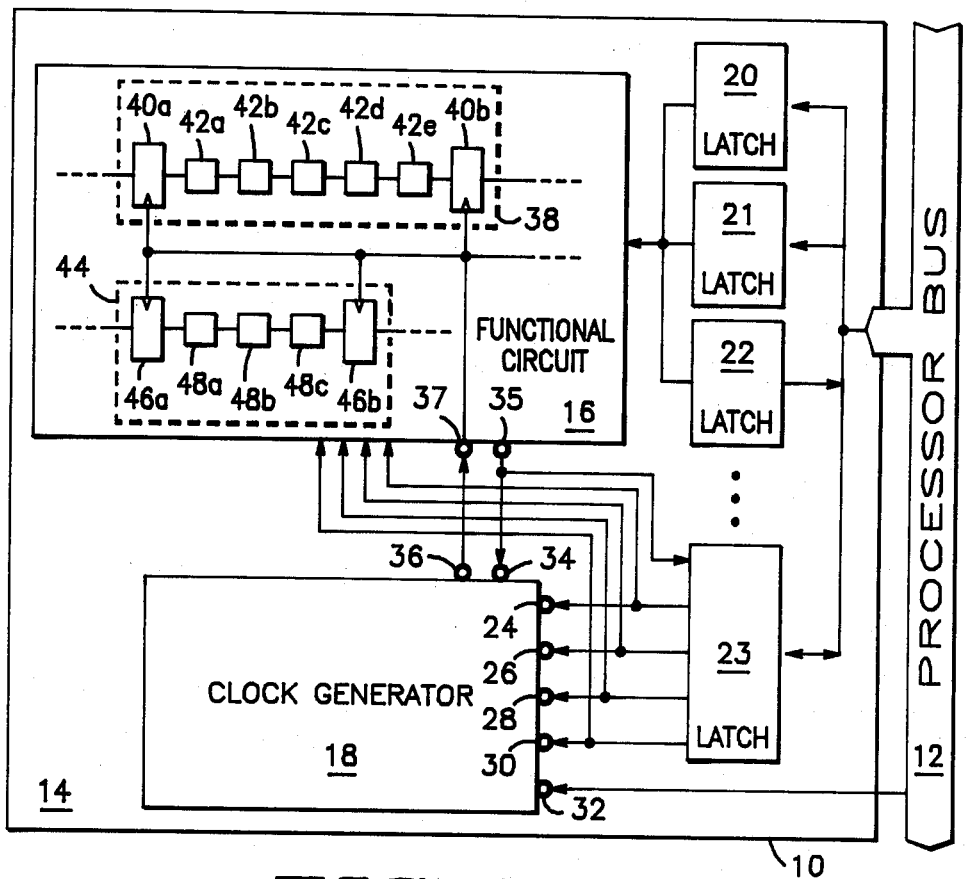
FIG. 1 combines a representation of a physical embodiment and a block diagram of the present invention.

Referring to FIG. 1, an integrated circuit (IC) 10 couples to a processor bus 12. Processor bus 12 includes conventional address, data, and control lines as may be required for a processor (not shown) to successfully communicate with IC 10. A functional circuit 16, a clock generator 18, and interface devices, such as latches 20, 21, 22, and 23 reside on a substrate 14 within IC 10.

Functional circuit 16 represents a circuit which performs a dedicated task. The dedicated task represents a process or job which the processor needs to have executed and which may be performed by IC 10 substantially without communication or interference from other ICs or devices. In other words, functional circuit 16 performs a task in which circuits contained on substrate 14 perform substantially the entire task. Further, the task represents one which may advantageously be performed asynchronously from other processes.

Digital signal processing functions may represent one example of such a dedicated task. Cryptographic algorithms may represent another example of such a dedicated task. These tasks typically perform a relatively large quantity of arithmetic operations on initial data before arriving at final results. By referring to the remaining portion of this description, those skilled in the art will recognize that functional circuit 16 need not be limited to a particular type of task. Rather, the present invention applies equally well to any one of a wide variety of diverse tasks being performed by functional circuit 16. Accordingly, the remainder of this description describes functional circuit 16 in terms which characterize all of the diverse tasks which may advantageously be performed by functional circuit 16.

Functional circuit 16 contains a clock input node 37 which receives a clock signal that drives functional circuit 16. Clock input node 37 connects to a slowest signal path 38 at clock inputs of latches 40a and 40b and connects to a non-critical signal path 44 at clock inputs of latches 46a and 46b. Devices 42a, 42b, 42c, 42d, and 42e are connected substantially in series between an output of latch 40a and an input of latch 40b. Likewise, devices 48a, 48b, and 48c are connected substantially in series between an output of latch 46a and an input of latch 46b. Inputs of latches 40a and 46a along with outputs of latches 40b and 46b couple to other portions of functional circuit 16.

Slowest signal path 38 represents the signal path within functional circuit 16 that has the slowest propagation delay of all signal paths within functional circuit 16. Non-critical signal path 44 represents any other signal path within functional circuit 16. A signal clocked into latch 40a of slowest signal path 38 by a rising or falling edge of a clock input signal applied at clock input node 37 must propagate through latch 40a, devices 42a, 42b, 42c, 42d, and 42e, and meet a set-up time of latch 40b before the next rising or falling edge, respectively, of the clock input signal occurs. The duration of this time period represents the slowest propagation delay within functional circuit 16.

The slowest propagation delay defines the true maximum speed of operation for functional circuit 16. In order for functional circuit 16 to properly operate, the clock input signal must exhibit a period equal to or slower than the slowest propagation delay. Non-critical signal path 44 plays no part in defining the slowest propagation delay. Thus, one need only identify slowest signal path 38 in order to identify the true maximum speed.

Functional circuit 16 contains a process complete output node 35 for supplying a signal that indicates the completion of the dedicated task performed by functional circuit 16. Additionally, functional circuit 16 contains a data port which couples to latches 20, 21, and 22.

Latches 20–22 represent conventional devices which pass data between functional circuit 16 and processor bus 12. As shown in FIG. 1, latches 20 and 21 represent input ports in which the processor writes data for use by functional circuit 16. Latch 22 represents an output port in which functional circuit 16 stores data so that the processor may read the data. No limit is placed on the number of data latches utilized by the present invention. Rather, the particular requirements of functional circuit 16 for each application control the number of data input and output latches.

Latch 23 represents a status/control interface between clock generator 18 and functional circuit 16 on one side and processor bus 12 on the other. Accordingly, outputs from latch 23 connect to a run node 24, a stop node 26, reset node 28, and a clock select node 30 of clock generator 18 as well as to inputs of functional circuit 16. Corresponding inputs of latch 23 couple to processor bus 12. Additionally, the process complete node 35 of functional circuit 16 connects to an input node of latch 23 with a corresponding output node coupled to processor bus 12.

The processor writes bits of data to latch 23 to control operation of clock generator 18 and functional circuit 16. The processor reads bits of data from latch 23 to monitor the status of operations within functional circuit 16. Latch 23 is not limited to the particular number and description of signals described above but may accommodate any number of signals required by a particular application. For example, other signals may couple to processor bus 12 through latch 23 to communicate information about error conditions.

Clock generator 18 contains a clock output node 36 which couples to clock input node 37 of functional circuit 16 and a process complete input node 34 which couples to process complete output node 35 of functional circuit 16. Additionally, clock generator 18 contains an external clock node 32 that couples to processor bus 12.

Clock generator 18 produces a clock signal which runs at the true maximum frequency for functional circuit 16. Since both clock generator 18 and functional circuit 16 are constructed on substrate 14, clock generator 18 compensates for temperature and process caused variations in the true maximum speed of functional circuit 16. The frequency of the clock signal produced by clock generator 18 varies to reflect process and temperature variances. Accordingly, process caused variations are compensated because clock generator 18 is always physically made from the same batch and section of a semiconductor wafer as functional circuit 16. Slowest signal path 38 of functional circuit 16 controls the true maximum speed. Accordingly, process variations which affect slowest signal path 38 also affect clock generator 18. Likewise, clock generator 18 physically resides near slowest signal path 38. Thus, a temperature change that affects slowest signal path 38 also affects clock generator 18.

Figure 2:
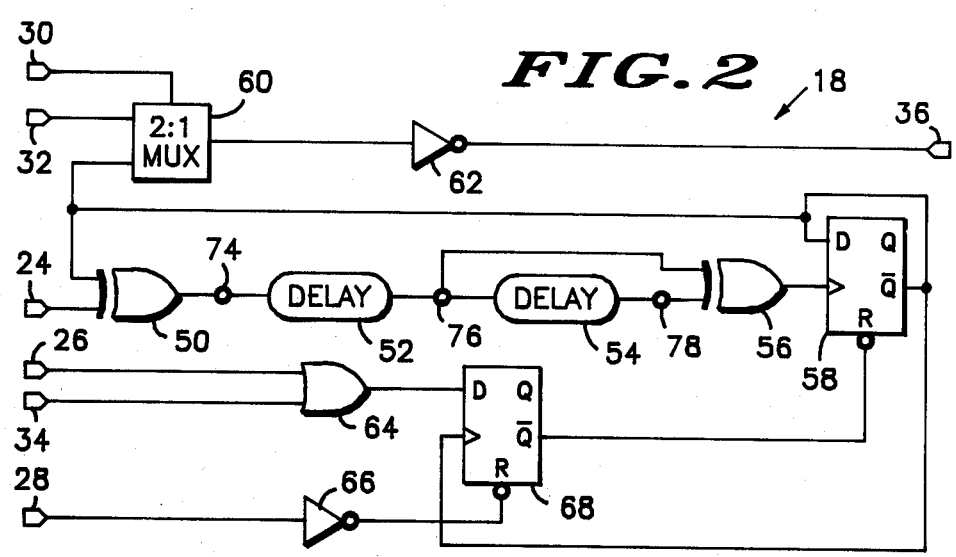
FIG. 2 shows a circuit diagram of a preferred embodiment of a clock generator portion of FIG. 1.
Figure 3:
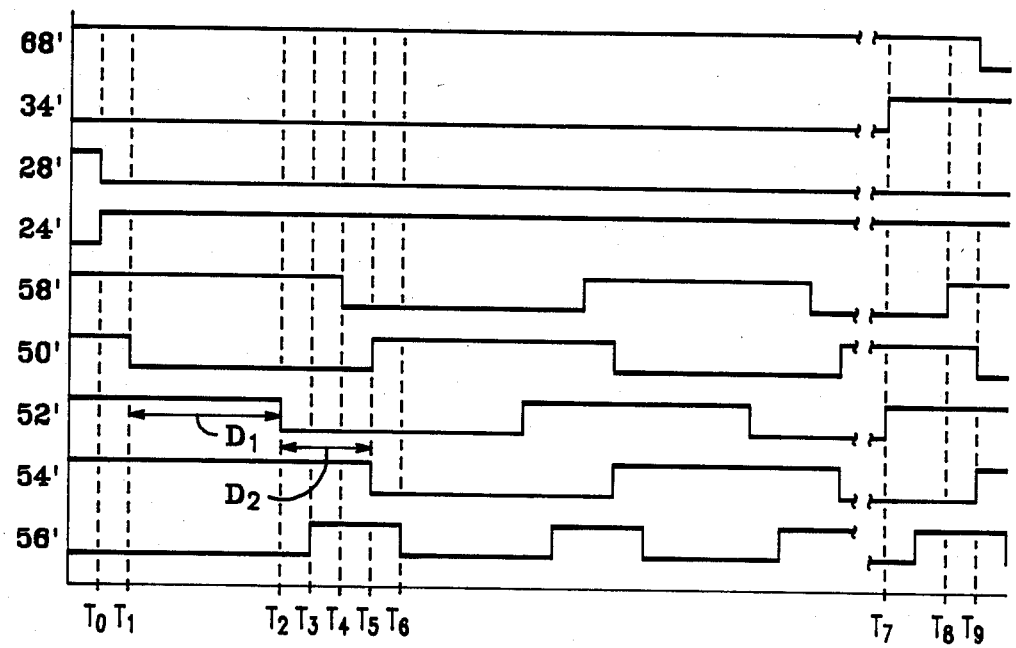
FIG. 3 shows a timing diagram of the circuit shown in FIG. 2.

A preferred embodiment of clock generator 18 is described in connection with FIGS. 2-4. In FIG. 2 clock select node 30 connects to a select input of a two-to-one multiplexer 60, and external clock node 32 connects to a first data input of multiplexer 60. Run node 24 connects to a first input of an Exclusive OR gate 50, and an output of Exclusive OR gate 50 connects to a node 74 and an input of a delay element 52. An output of delay element 52 connects to a node 76, an input of a delay element 54, and a first input of an Exclusive OR gate 56. An output of delay element 54 connects to a node 78 and to a second input of Exclusive OR gate 56. An output of Exclusive OR gate 56 connects to a clock input of a D flip-flop 58. An inverting output of flip-flop 58 connects to a D input of flip-flop 58, a second input of Exclusive OR gate 50, and a second data input of multiplexer 60. An output of multiplexer 60 connects to an input of an inverter 62, and an output of inverter 62 connects to clock output node 36.

Stop node 26 connects to a first input of an OR gate 64, and process complete input node 34 connects to a second input of OR gate 64. An output of OR gate 64 connects to a D input of a D flip-flop 68. A clock input of flip-flop 68 connects to the inverting output of flip-flop 58, and an inverting output of flip-flop 68 connects to a reset input of flip-flop 58. Reset node 28 connects to an input of inverter 66, and an output of inverter 66 connects to a reset input of flip-flop 68.

The FIG. 2 embodiment of clock generator 18 permits synchronously starting and stopping a clock signal produced by clock generator 18 under processor control. The starting and stopping of clock generator 18 provides one method for processor bus 12 (see FIG. 1) to successfully communicate with functional circuit 16 when functional circuit 16 is operating asynchronously from processor bus 12. Specifically, the timing diagram depicted in FIG. 3 describes the operation of the FIG. 2 embodiment of clock generator 18. In FIG. 3 traces show digital logic signals which exhibit one of two possible logical states at particular points in time. FIG. 3 assumes that the clock signal produced by clock generator 18 is stopped at the beginning of the timing diagram.

Thus, trace 28' shows a reset signal applied at node 28 and removed at a point in time $T_0$. The reset signal resets flip-flop 68, causing a signal 68' produced at the inverting output of flip-flop 68 to exhibit a high level and permitting flip-flop 58 to respond to future clock pulses presented at its clock input. A signal 58' produced at the inverting output of flip-flop 58 exhibits a high level when the clock is stopped.

At point in time $T_{0a}$ run signal 24' applied at node 24 goes active simultaneously with the removal of reset signal 28'. Both reset signal 28' and run signal 24' are controlled by the processor over processor bus 12 (see FIG. 1). A point in time $T_1$ occurs after $T_0$ by a propagation delay of Exclusive OR gate 50. Accordingly, at $T_1$ an output signal 50' from Exclusive OR gate 50 changes state to a low level in response to the activation of run signal 24'.

A point in time $T_2$ occurs after $T_1$ by a propagation delay period associated with delay element 52. Accordingly, a signal 52' output from delay element 52 duplicates signal 50' but is delayed by a duration $D_1$ from signal 50'. In the present embodiment, $D_1$ is chosen to approximately equal one-half the propagation delay of slowest signal path 38 of functional circuit 16 (see FIG. 1). However, $D_1$ may be shortened by the total propagation delay of Exclusive OR gates 50 and 56 and of flip-flop 58.

Together, Exclusive OR gate 56 and delay element 54 represent a pulse generator that responds to both rising and falling edges. The instant signal 50' produces either a rising or a falling edge, the inputs of Exclusive OR gate 56 are in opposing states and the output of Exclusive OR gate 56 produces a high level signal 56'. Accordingly, a point in time $T_3$ occurs after $T_2$ by a propagation delay of Exclusive OR gate 56 and represents the point in time where signal 56' first exhibits a high level. Delay element 54 duplicates the signal 52', but delays a signal 54' produced by delay element 54 from signal 52' by delay $D_2$. Delay $D_2$ is chosen to be less than delay $D_1$, and in the preferred embodiment delay $D_2$ approximately equals one-fourth of the propagation delay of slowest signal path 38 (see FIG. 1).

Meanwhile, the rising edge of signal 56' clocks flip-flop 58, causing signal 58' to toggle, or change states, at a point in time $T_4$, which occurs a propagation delay of flip-flop 58 after $T_3$. A point in time $T_5$ follows $T_2$ by delay $D_2$ and represents the point in time when signal 54' goes low, causing both inputs to Exclusive OR gate 56 to be at the same logical level. Finally, at a point in time $T_6$, which occurs a propagation delay of Exclusive OR gate 56 after $T_5$, signal 56' returns to a low level, marking the end of the pulse produced by the pulse generator.

At $T_4$ signal 58' changed levels. Since signal 58' drives Exclusive OR gate 50, signal 50' again changes state at approximately time $T_5$ in response to the changed level of signal 58'. The above described process concerning signals 50'–58' continues indefinitely until an external event happens to stop signal 58' from changing states in the prescribed manner. Accordingly, signal 58' represents the clock which drives functional circuit 16 (see FIG. 1), through multiplexer 60 and inverter 62, at the true maximum speed for functional circuit 16.

Flip-flop 68 and OR gate 64 provide for synchronously stopping clock signal 58'. FIG. 3 shows a process complete signal 34' occurring at node 34 at a point in time $T_7$. Signal 34' passes through OR gate 64 to the D input of flip-flop 68. Signal 58' produces a rising edge at a point in time $T_8$. A point in time $T_9$ occurs a propagation delay of flip-flop 68 after $T_8$. Thus, at $T_9$ signal 68' exhibits a low level. The low level on signal 68' feeds the reset input of flip-flop 58 and prevents signal 58' from further changing states. Accordingly, after $T_9$ signal 58' is stopped, or no longer changes states, until an external event such as described above occurs to start the clock.

Referring to FIG. 2, node 26 supplies a stop signal from the processor over processor bus 12. The stop signal operates substantially the same as process complete signal 34' in synchronously commanding the stopping of operations of clock generator 18.

Additionally, a clock select signal applied from the processor at node 30 controls operation of multiplexer 60 to supply either clock signal 58' or an externally supplied clock signal to clock output node 36. The externally supplied clock, which is applied at node 32, may advantageously represent a synchronous clock for operating functional circuit 16 (see FIG. 1) in a test mode or other mode which defeats asynchronous, true maximum speed operation.

Figure 4:
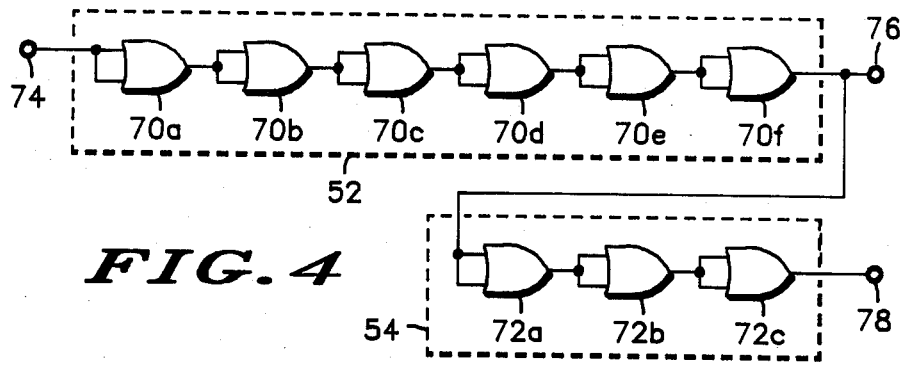
FIG. 4 shows particular embodiments of delay element portions of the circuit shown in FIG. 2.

FIG. 4 shows particular embodiments for delay elements 52 and 54 of FIG. 2. Node 74 connects to first and second inputs of an OR gate 70a. An output of gate 70a connects to first and second inputs of OR gate 70b, and an output of gate 70b connects to first and second inputs of an OR gate 70c. An output of gate 70c connects to first and second inputs of an OR gate 70d, and an output of gate 70d connects to first and second inputs of an OR gate 70e. An output of gate 70e connects to first and second inputs of an OR gate 70f, and an output of gate 70f connects to node 76.

Likewise, node 76 connects to first and second inputs of an OR gate 72a, and an output of gate 72a connects to first and second inputs of an OR gate 72b. An output of gate 72b connects to first and second inputs of an OR gate 72c, and an output of gate 72c connects to node 78.

Gates 70a–70f form delay element 52, and gates 72a–72c form delay element 54. The frequency of clock signal 58' (see FIG. 3) is influenced by the propagation delay of delay element 52 along with propagation delays of devices in the loop that generates clock signals 58'. Consequently, the longer the propagation delay of delay element 52, the slower the frequency of clock signal 58'. Although OR gates are shown, any type of gate or collection of gates which duplicates an input signal may be used. Longer propagation delays may be obtained by either using slower, more complicated devices, or a larger number of devices. The exact number and type of gates contained within each delay element are selected to provide specified delays, as described above in connection with FIG. 2. However, temperature and process considerations may be ignored in building a delay element having a specified propagation delay. Active devices, such as OR gates, are used as opposed to passive devices so that process and temperature effects which influence slowest signal path 38 (see FIG. 1) have a similar influence upon the delay element.

The foregoing description uses preferred embodiments to illustrate the present invention. However, those skilled in the art will recognize that changes and modifications may be made in these embodiments without departing from the scope of the present invention. For example, the particular clock generator described in FIG. 2 may be extensively modified. Those skilled in the art can devise free-running clocks using the teaching presented herein and use alternate methods for interfacing between processor bus 12 and an asynchronously operating functional circuit 16. Additionally, those skilled in the art will recognize that the particular gates and polarities described herein may be replaced with a wide variety of devices which represent logical equivalents. Further, many different memory elements may be substituted for the flip-flops described herein. These and other changes and modifications obvious to those skilled in the art are intended to be included within the scope of this invention.

We claim:

1. A self-compensated integrated circuit comprising:
 a functional circuit for performing a dedicated task, said functional circuit being constructed on a substrate, having a clock input node and having a slowest signal path, said functional circuit slowest signal path having a propagation delay associated therewith which is slower than propagation delays for all other signal paths of said functional circuit; and
 a clock generator constructed on the substrate and having a clock output node that couples to said functional circuit clock input node, said clock generator operating to generate a clock signal which exhibits a frequency influenced by a propagation delay characteristic of a delay element portion of said clock generator, said delay element portion being constructed from active components and causing a signal propagating through the delay element to exhibit a delay of a predetermined duration relative to the propagation delay of said functional circuit slowest signal path.

2. An integrated circuit as claimed in claim 1 wherein said functional circuit additionally comprises an output node for providing a signal that indicates completion of the dedicated task.

3. An integrated circuit as claimed in claim 1 wherein said clock generator delay element is configured to provide a delay approximately equal to one-half of the propagation delay of the slowest signal path of the functional circuit.

4. An integrated circuit as claimed in claim 1 wherein said clock generator comprises:
 a memory element having a clock input and being configured to change logical states upon the receipt of a signal applied at said memory element clock input, and having an output coupled to the clock output node of said clock generator; and
 a pulse generator having an input responsive to rising and falling edge signals and having an output coupled to the clock input of said memory element, wherein the delay element of said clock generator has an input coupled to the output of said memory element and an output coupled to the input of said pulse generator.

5. An integrated circuit as claimed in claim 4 wherein said pulse generator comprises:
 a pulse generator delay element having an input which represents the input of said pulse generator, an output, and a propagation delay associated therewith which is shorter than the propagation delay of said delay element; and
 an Exclusive OR logical device having a first input coupled to the output of said pulse generator delay element, a second input coupled to the input of said pulse generator delay element, and an output coupled to the output of said pulse generator.

6. An integrated circuit as claimed in claim 4 additionally comprising an Exclusive-OR logical device having an output coupled to the input of said delay element, a first input coupled to the output of said memory element, and a second input adapted to receive a signal which controls operation of said clock generator.

7. An integrated circuit as claimed in claim 4 additionally comprising means, coupled to said memory element, for synchronously stopping and starting operation of said clock generator.

8. An integrated circuit as claimed in claim 7 wherein said means for stopping and starting comprises a second memory element having a data input adapted to receive a signal which commands the stopping of operation of said clock generator, a clock input coupled to the output of said memory element, and an output coupled to said memory element.

9. A method of operating an integrated circuit comprising the steps of:
 performing a dedicated task in a functional circuit portion of the integrated circuit, the functional circuit portion being constructed on a substrate, responsive to a clock signal, and characterized by a slowest signal path exhibiting a propagation delay;
 generating the clock signal for the functional circuit of said performing step in a clock generator constructed on the substrate;
 influencing a frequency parameter of the clock signal of said generating step by a propagation delay characteristic of a delay element portion of the clock generator; and
 constructing the delay element portion of the clock generator entirely from active components arranged so that the propagation delay parameter of the delay element is a predetermined duration relative to the propagation delay of the slowest signal path.

10. A method as claimed in claim 9 wherein said performing step comprises the step of generating a signal which indicates the completion of the dedicated task.

11. A method as claimed in claim 9 wherein said generating step comprises the steps of:
 toggling a logical state presented at an output of a memory element in response to a pulse received at a clock input of the memory element;
 feeding a signal produced at the output of the memory element through the delay element;
 producing a pulse from a pulse generator in response to a rising and a falling edge of a signal output from the delay element; and
 driving the clock input of the memory element from a signal output from the pulse generator.

12. An integrated circuit being self-compensated for speed of operation, said integrated circuit comprising:
 a functional circuit for performing a dedicated task, said functional circuit being constructed on a substrate, having a process complete output node for providing a signal that indicates completion of the dedicated task, having a clock input node, and having a slowest signal path, said functional circuit slowest signal path having a propagation delay associated therewith which is slower than propagation delays for all other signal paths of said functional circuit; and
 a clock generator constructed on the substrate, said clock generator comprising,
  a memory element having a clock input and being configured to change logical states upon the receipt of a signal applied at said memory element clock input, and having an output coupled to the clock input node of said functional circuit;

a delay element constructed from active devices, having an input coupled to the output of said memory element, a propagation delay associated therewith which approximately equals one-half of the propagation delay of the slowest signal path of said functional circuit, and an output, and a pulse generator having an input coupled to the output of said clock generator delay element, an output coupled to the clock input of the memory element, and being responsive to rising and falling edges of a signal produced at the output of the delay element.

* * * * *